United States Patent [19]

Bertin et al.

[11] 4,388,704

[45] Jun. 14, 1983

[54] NON-VOLATILE RAM CELL WITH ENHANCED CONDUCTION INSULATORS

[75] Inventors: Claude L. Bertin, South Burlington; Harish N. Kotecha, Essex Junction; Francis W. Wiedman, Stowe, all of Vt.

[73] Assignee: International Business Machines Corporation, Armonk, N.Y.

[21] Appl. No.: 192,579

[22] Filed: Sep. 30, 1980

[51] Int. Cl.³ .............................................. G11C 11/40
[52] U.S. Cl. ..................................... 365/154; 357/23; 365/185
[58] Field of Search ........................ 365/154, 184, 185; 357/23 VT

[56] References Cited

U.S. PATENT DOCUMENTS

| 3,651,492 | 3/1972 | Lockwood | 365/154 |
| 3,676,717 | 7/1972 | Lockwood | 307/304 |
| 3,728,695 | 4/1973 | Bentchkowsky | 365/185 |
| 4,095,281 | 6/1978 | Denes | 365/156 |
| 4,103,185 | 7/1978 | Denes | 365/185 |
| 4,103,348 | 7/1978 | Fagan | 365/228 |
| 4,122,541 | 10/1978 | Uchida | 365/154 |
| 4,128,773 | 12/1978 | Troutman et al. | 307/238 |
| 4,175,290 | 11/1979 | Harari | 365/154 |
| 4,207,615 | 6/1980 | Mar | 365/95 |
| 4,217,601 | 8/1980 | De Keersmaecker et al. | 357/23 VT |
| 4,330,850 | 5/1982 | Jacobs et al. | 365/185 |

FOREIGN PATENT DOCUMENTS 2042296 9/1980 United Kingdom ................ 365/154

OTHER PUBLICATIONS

"High Current Injection into SiO₂ from Si Rich SiO₂ Films and Experimental Applications", by D. J. DiMaria et al., J. Appl. Pys. 51(5), May 1980, pp. 2722-2735.

"Electrically-Alterable Memory Using A Dual Electron Injector Structure", by D. J. DiMaria et al., IEEE Electron Device Letters, vol. EDL-1, No. 9, Sep. 1980, pp. 179-181.

Primary Examiner—Stuart N. Hecker
Attorney, Agent, or Firm—Stephen J. Limanek

[57] ABSTRACT

This invention provides improved non-volatile semiconductor memories which include a volatile circuit coupled to a non-volatile device having a floating gate and first and second control gates capacitively coupled to the floating gate with a charge injector structure disposed between the floating gate and one of the two control gates. The volatile circuit may be a dynamic one-device cell or a static cell such as a conventional flip-flop or latch cell.

17 Claims, 7 Drawing Figures

NON-VOLATILE RAM CELL WITH ENHANCED CONDUCTION INSULATORS

TECHNICAL FIELD

This invention relates to non-volatile semiconductor memory cells and more particularly to cells which utilize a device having a floating gate and an enhanced conduction insulator.

BACKGROUND ART

A number of circuits have evolved which take advantage of the ability of field effect transistors to store charge and thus serve as memory cells. Such cells may be either dynamic or static in nature. The dynamic cells may employ only a single field effect transistor and the static cells may be arranged in a flip-flop configuration, as is well known. Each of these types of cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

Known devices for producing variable threshold voltages, such as field effect transistors having metal-nitride-oxide-silicon (MNOS) and field effect transistors which include a floating gate are capable of storing information in a non-volatile manner for long periods of time. By incorporating such non-volatile devices into memory cells, there has been provided normally operating volatile cells which do not require a backup or alternate power supply for preserving information when power interruption or failure occurs in the main power supply.

Non-volatile memory cells which use the non-volatile MNOS devices are capable of retaining information stored volatilely in a cell but these devices require high voltage pulses for writing and erasing the information, they are slow and they require rather complex processes for their fabrication. Examples of non-volatile semiconductor memory cells are taught in U.S. Pat. Nos. 3,676,717, filed Nov. 2, 1970, 4,095,281, filed Mar. 4, 1976, 4,103,348, filed Aug. 29, 1977 and 4,122,541, filed Aug. 25, 1976.

Known non-volatile memory cells which use conventionally arranged floating gate devices are also capable of preserving information stored volatilely in a cell but these devices likewise require high voltage pulses for writing and erasing the information, they are slow and require high currents, approximately one milliampere per device, to write. Examples of known non-volatile semiconductor memory cells having incorporated therein volatile storage are taught in U.S. Pat. Nos. 4,128,773, filed Nov. 7, 1977 and 4,207,615, filed Nov. 17, 1978.

In commonly assigned U.S. patent application Ser. No. 153,359, filed May 27, 1980 by H. N. Kotecha, now U.S. Pat. No. 4,334,292, there is disclosed an electrically erasable programmable read only memory which utilizes a four port or terminal device having a floating gate with two control gates coupled to the floating gate. An enhanced conduction insulator arranged as a dual electron injector structure is disposed between the floating gate and one of the two control gates to charge and discharge the floating gate. Commonly assigned U.S. patent application Ser. No. 160,530 filed on June 18, 1980 by H. N. Kotecha and F. W. Wiedman, now U.S. Pat. No. 4,336,603 discloses a three port or terminal electrically erasable programmable read only memory which utilizes the enhanced conduction insulator. A detailed discussion of enhanced conduction insulators may be found in an article entitled "High Current Injection Into $SiO_2$ from Si rich $SiO_2$ Films and Experimental Applications" by D. J. DiMaria and D. W. Dong, Journal of Applied Physics 51(5), May 1980, pp. 2722–2735 and a basic memory cell which utilizes the dual electron injector structure is taught in an article entitled "Electrically-Alterable Memory Using A Dual Electron Injector Structure" by D. J. DiMaria, K. M. DeMeyer and D. W. Dong, IEEE Electron Device Letters, Vol. EDL-1, No. 9, Sept. 1980, pp. 179–181.

DISCLOSURE OF THE INVENTION

It is an object of this invention to provide an improved non-volatile semiconductor memory which is more versatile than such known memories and which is fabricated by a simple process.

It is another object of this invention to provide an improved non-volatile semiconductor memory which operates at lower voltages and requires less power during data transfer between volatile to non-volatile modes.

It is yet another object of this invention to provide an improved non-volatile semiconductor memory which operates faster than known non-volatile memories.

In accordance with the teachings of this invention improved non-volatile semiconductor memories are provided which include a volatile circuit coupled to a non-volatile device having a floating gate and first and second control gates capacitively coupled to the floating gate with a dual charge or electron injector structure disposed between the floating gate and one of the two control gates. The volatile circuit may be a dynamic one device cell or a static cell such as a conventional flip-flop or latch cell.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
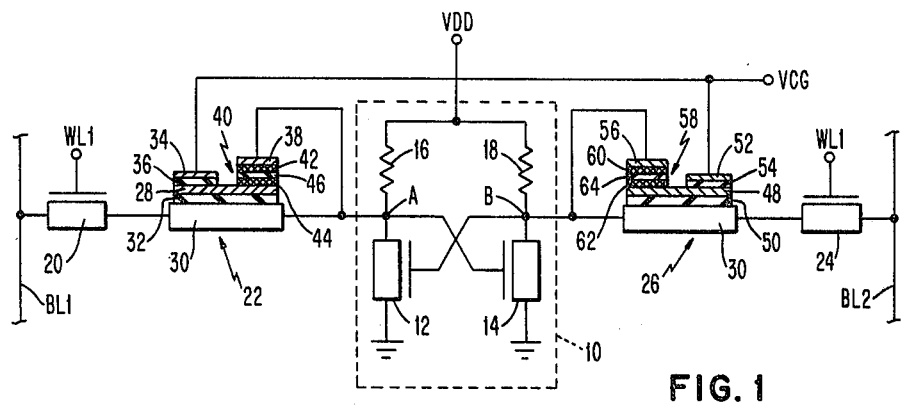
FIG. 1 is a circuit diagram of one embodiment of the non-volatile memory cell of the present invention.

Referring to FIG. 1 of the drawings in more detail, there is shown a first embodiment of the non-volatile memory cell of the present invention. This cell includes a conventional flip-flop or latch circuit 10 having first and second cross-coupled field effect transistors 12 and 14 and first and second load resistors 16 and 18 connected between a voltage source terminal VDD and the cross-coupled transistors 12, 14, with the first load resistor 16 being serially connected with the first transistor 12 and the second load resistor 18 being serially connected with the second transistor 14. A data node A is formed at the common point between the first load resistor 16 and the first transistor 12 and a data node B is formed between the second load resistor 18 and the second transistor 14. The load resistors 16 and 18 may be made, e.g., as diffusion resistors or as polysilicon resistors. Field effect transistors may also be used in the loads. A first bit line BL1 is connected to data node A through a first input/output field effect transistor 20 and a non-volatile device 22 and a second bit line BL2 is connected to storage node B through a second input/output field effect transistor 24 and a second non-volatile storage device 26. The first and second input/output transistors 20 and 24 each have a control gate connected to a common word line WL1.

The first non-volatile memory device 22 includes a floating gate 28 insulated from a semiconductor substrate 30 by a layer of insulation 32. A first control gate 34 is insulated from the floating gate 28 by a thin dielectric layer 36 forming a capacitor with the floating gate 28 and the first control gate 34 having a high capacitance value. A second control gate 38 is separated from the floating gate 28 by an enhanced conduction insulator which is a dual electron injector structure 40 having a first silicon-rich layer 42, a second silicon rich layer 44 and a conventional insulator 46 which may be a typical silicon dioxide layer. The second non-volatile memory device 26 includes a floating gate 48 insulated from the semiconductor substrate 30 by an insulating layer 50. A first control gate 52 is separated from the floating gate 48 by a thin layer of insulation 54 forming a capacitor with the floating gate 48 and the first control gate 52 having a high capacitance. A second control gate 56 is separated from the floating gate 48 by an enhanced conduction insulator which is a dual electron injector structure 58 having a first silicon-rich layer 60, a second silicon-rich layer 62 and a normal or conventional insulating layer 64 which may be made of silicon dioxide. The first control gate 34 of the first non-volatile memory device 22 and the first control gate 52 of the second non-volatile memory device 26 are connected to a pulse source terminal VCG. The dual electron injector structures 40 and 58 may be made by the method described in the above identified Journal of Applied Physics article with the silicon-rich layers each having a thickness of 100 to 250 Angstroms and with each of the silicon dioxide layers 46 and 64 having a similar thickness.

Figure 2:
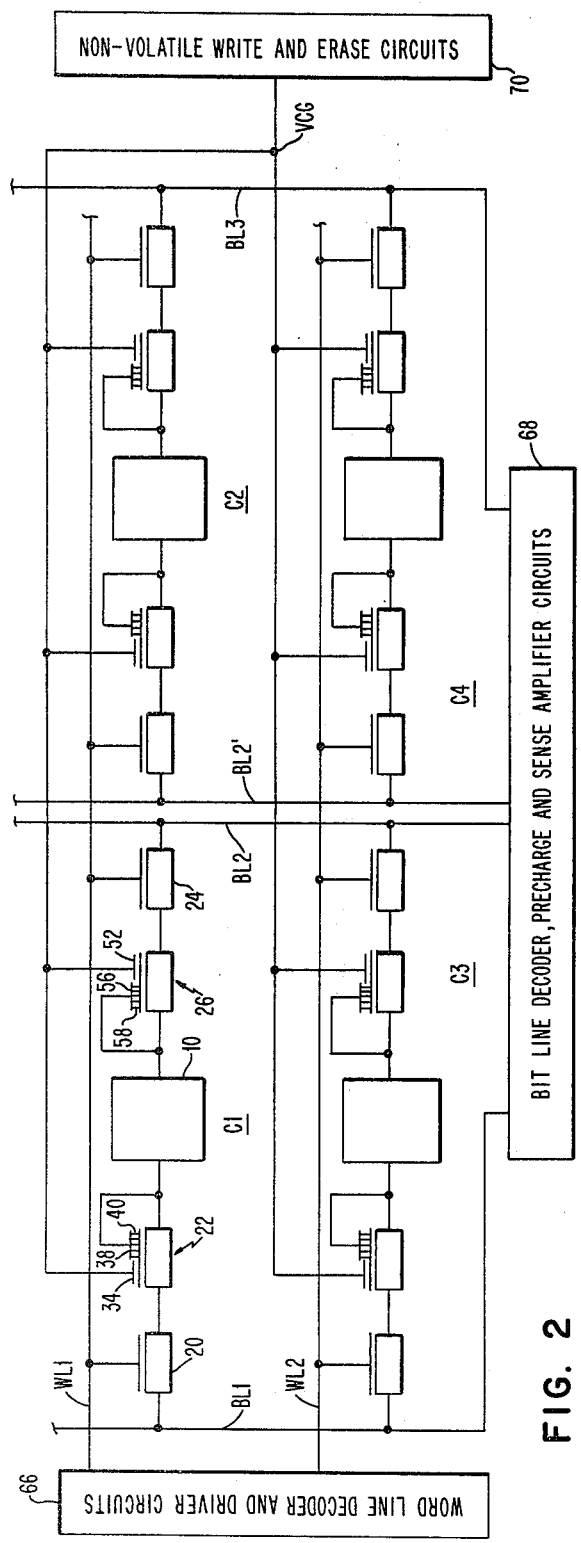
FIG. 2 illustrates a memory system of the present invention having an array of cells each of which may be of the type illustrated in FIG. 1 of the drawings.

FIG. 2 illustrates a 2×2 array of non-volatile memory cells of the type shown in FIG. 1 of the drawings wherein similar elements in the two figures are identified by the same reference characters. The array includes a first word line WL1 to which first and second cells C1 and C2 are connected and a second word line WL2 to which a third cell C3 and a fourth cell C4 are connected. First and third cells C1 and C3 are connected to first and second bit lines BL1 and BL2 and the second and fourth cells C2 and C4 are connected to a third bit line BL2' and a fourth bit line BL3. The first and second word lines WL1 and WL2 are connected to a word line decoder and driver circuit 66 which may employ conventional circuitry and the first, second, third and fourth bit lines BL1, BL2 BL2' and BL3 are connected to bit line decoder, precharge and sense amplifier circuits 68 which may also utilize conventional circuitry. The first control gates of each of the non-volatile memory devices, such as devices 22 and 26 identified in the first cell C1, are connected to a common terminal VCG which receives pulses from non-volatile write and erase circuits 70, which may be of any known type.

Figure 3:
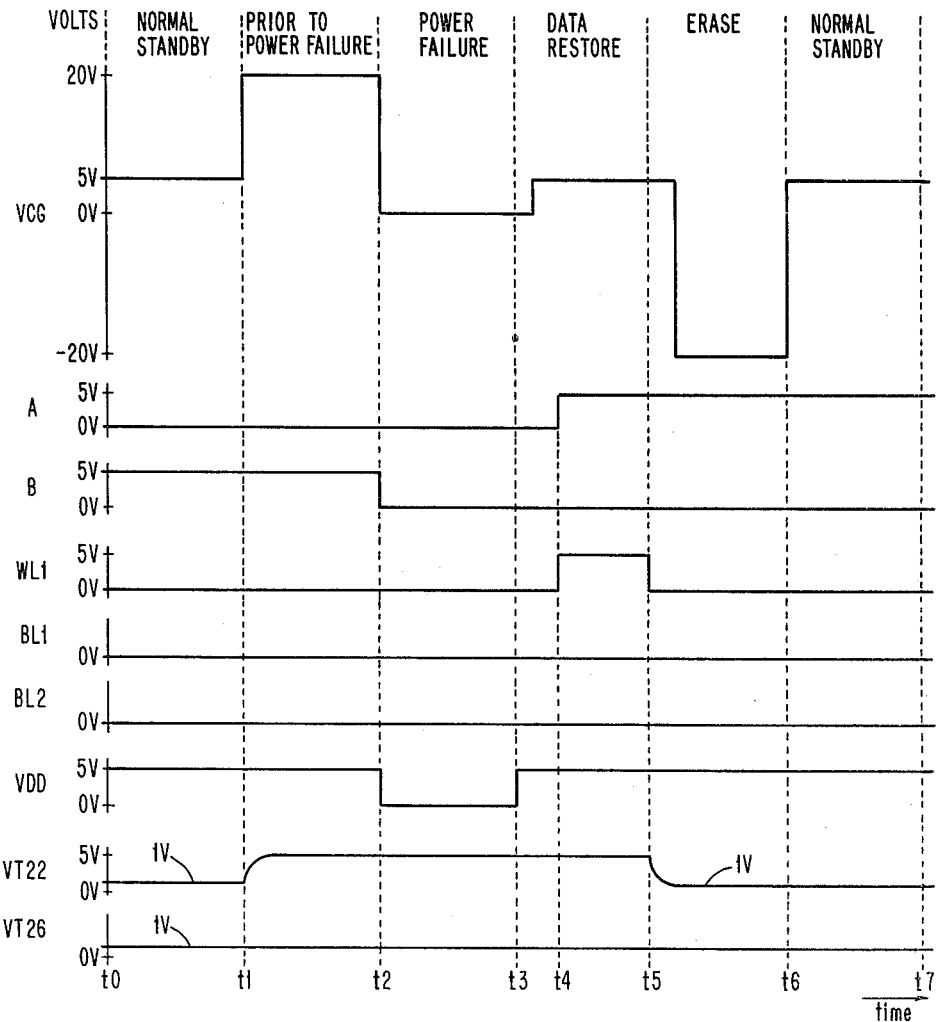
FIG. 3 is a pulse program which may be used to operate the cell of FIG. 1 and the system illustrated in FIG. 2 of the drawings.

In order to better understand the operation of the non-volatile memory cell illustrated in FIG. 1 and also of the system illustrated in FIG. 2 of the drawings reference may be had to the pulse program indicated in FIG. 3 of the drawings. During normal operation of the non-volatile memory cell illustrated, e.g., in FIG. 1 of the drawing, the cell performs as a conventional volatile flip-flop storage circuit which includes the flip-flop or latch circuit 10 coupled to first and second bit lines BL1 and BL2 through the first and second input/output transistors 20 and 24, with first and second non-volatile devices 22 and 26 providing little or no impedance in the input/output channel between data nodes A and B and the first and second bit lines BL1 and BL2. To allow volatile operation, a voltage of approximately +5 volts is applied from terminal VCG to each of the first control gates 34 and 52 of the first and second non-volatile devices 22 and 26 to provide a conductive path in semiconductor substrate 30 under floating gates 28 and 48. With only approximately +5 volts on the first control gates 34 and 52, the floating gates 28 and 48 have little or no charge stored thereon. In normal operation as well as in normal standby as indicated between times t0 and t1 of FIG. 3 of the drawings, the voltage threshold of devices 22 and 26 is approximately 1 volt. Thus, the +5 volts on the first control gates 34 and 52 is sufficient to provide a highly conductive path in semiconductor substrate 30 below the floating gates 28 and 48 of devices 22 and 26. Since the voltage source or power supply connected to terminal VDD as well as the volatile cell circuit itself have a considerable amount of capacitance, the cell can be operated for a period of time, for example, about 1 or more seconds after the interruption of power, which is a sufficient length of time to transfer information stored at the data nodes A and B in the volatile latch circuit 10 to the non-volatile devices 22 and 26.

Prior to actual power failure but at a time when power failure is anticipated, such as between times t1 and t2 as indicated in FIG. 3 of the drawings, the voltage at terminal VCG is increased from +5 volts to +20 volts. Assuming that at this time transistor 12 of latch circuit 10 is turned on and that transistor 14 is off, the voltage at data node A will be at approximately 0 volts and the data at node B will be at approximately +5 volts. With the voltage on the first control gate 34 of non-volatile device 22 at +20 volts and the voltage at the second control gate 38 being approximately equal to 0 volts, electrons will readily flow from the first silicon-rich layer 42 onto the floating gate 28 producing a negative charge on floating gate 28 which increases the threshold voltage of non-volatile device 22, as indicated at VT22 between times t1 and t2 in FIG. 3 of the drawings. Since the voltage at node B and, therefore, at the second control gate 56 of the second non-volatile device 26 is at +5 volts while the voltage at the first control gate 52 is at +20 volts, electrons will not flow from the first silicon-rich layer 60 to the floating gate 48 because the voltage differential between the first and second control gates 52 and 56 is equal to only 15 volts. Accordingly, the threshold voltage of non-volatile device 26 will not change, as indicated at VT26 in FIG. 3 of the drawings. During power failure, i.e., during times t2 to t3, the voltage at terminals VCG and VDD, as well as the voltage at data node B, will drop to 0 volts with the only indication of the data stored at data nodes A and B being the high threshold voltage in non-volatile device 22.

To restore the data from the non-volatile device 22 to data nodes A and B of latch circuit 10, after power is restored to power supply terminal VDD, the voltage at terminal VCG is increased to +5 volts between times t3 and t4 which tends to turn on or render conductive semiconductor substrate 30 under floating gates 28 and 48 of devices 22 and 26. However, since the threshold voltage of device 22 is at +5 volts a conductive path will not be produced in substrate 30 under floating gate 28 of device 22, but, since the threshold voltage of device 26 has not changed, i.e., it remains at 1 volt, a conductive path will be produced in substrate 30 under the floating gate 48 of device 26. With the first and second bit lines BL1 and BL2 held at ground potential and with +5 volts applied to terminal VDD, by applying a pulse to word line WL1 at time t4, it can be seen that the voltage at data node B will remain at ground potential, whereas the voltage on data node A will increase to approximately +5 volts. Prior to utilizing the restored data at data nodes A and B, the charge on the floating gate 28 of non-volatile device 22 is erased between times t5 and t6 to restore the conductive path in the semiconductor substrate 30 under the floating gate 28. This is accomplished by applying a negative voltage of approximately 20 volts to the first control gates 34 and 52 of the devices 22 and 26, respectively. Since the voltage at the second control gate 38 is at +5 volts and negative voltage exists on the floating gate, and, further the voltage to the first control gate 34 is at −20 volts, a sufficient voltage differential, i.e., over 25 volts, is provided across the dual electron injector structure 40 to cause electrons to flow from the floating gate 28 through the injector structure 40 to the second control gate 38 to discharge floating gate 28. Thus, the threshold voltage of the non-volatile device 22 returns to +1 volt. The voltage differance between gates 56 and 52 of device 26 is, on the otherhand, only 20 volts. This is not sufficient to make the dual electron injector structure 58 conductive, and consequently, the threshold voltage of device 26 remains unchanged. Although the restored data is the complement of the data stored in the volatile latch circuit 10 before power failure, by using simple suitable inverting circuits the data can be returned to its true form prior to utilization, or in the alternative it can be seen that the cycle just described can be repeated at the end of which the true or original data will be stored at data nodes A and B. With the voltage at terminal VCG returned to +5 volts, the volatile circuit is now returned to its standby condition, as indicated between times t6 and t7, and may be written or read at will. It is understood that other pulsing schemes are also possible to achieve similar results. For example, the need for the negative voltage of FIG. 3 during the erase cycle can be avoided by pulsing the voltage on terminal VDD to say +20 volts. Data node A will then assume +20 volts whereas data node B will maintain its 0 volt value. Since for this case terminal VCG is set at 0 volt value, the voltage differential across gates 56 and 52 of non-volatile device 26 is 0 volts. As a result no change on this device's threshold voltage occurred. However, the similar voltage differential for non-volatile device 22 is 20 volts; hence the erasure of this device takes place. The penalty paid by this scheme of pulsing is higher power dissipation. If the flip-flop cell was of high resistive polysilicon type, the power dissipation penalty is significantly reduced.

It should be understood that the voltages applied to write or erase data in non-volatile devices are not necessarily symmetrical. This phenomenon has been reported in the above cited article in IEEE Electron Device Letters.

Although the voltages applied to the terminal VCG for controlling the non-volatile devices 22 and 26 are indicated as having a magnitude of +20 and −20 volts, it should be understood that voltages of significantly lower values can be used but at the expense of longer switching times. Small voltage increases across the dual electron injector structure produce sharp drops in writing and erase times because of the exponential nature of the dual electron injector structure current-voltage characteristics. It should be understood that, if desired, one of the two non-volatile devices 22 and 26 may be eliminated without significantly altering the operation of the cell of FIG. 1.

It can be seen that each of the cells C1, C2, C3 and C4 shown in the array of the system illustrated in FIG. 2 of the drawing is operated in a similar manner to that described hereinabove in connection with the operation of the cell of FIG. 1. In the system of FIG. 2 one of the two word lines WL1 and WL2 is selected by the word line decoder and driver circuit 66 and two of the four bit lines BL1, BL2, BL2' and BL3 are selected by the bit line decoder, precharge and sense amplifier circuits 68 to write and read information associated with the volatile latch circuit 10 of a desired cell C1, C2, C3 or C4, to operate the desired static cell in the normal manner. When an impending power failure is sensed the voltage at terminal VCG, derived from non-volatile write and erase circuits 70, is increased from +5 volts to +20 volts and applied to the first control gate of each of the non-volatile devices to simultaneously transfer data from the volatile latch circuit 10 to the non-volatile devices, such as devices 22 and 26. Since the capacitances in the power supply and in the cells hold the information stored in the cells at data nodes A and B for one or more seconds, and since the simultaneous transfer of data to the non-volatile devices occurs in only a small fraction of a second, no information is lost due to the failure of power to the volatile circuits.

It should be noted that in the interest of clarity, an array having only four cells has been illustrated in FIG. 2 of the drawing, however, in practice hundreds of word lines would be used with each word line having hundreds of cells coupled thereto to provide an array of thousands of cells.

Figure 4:
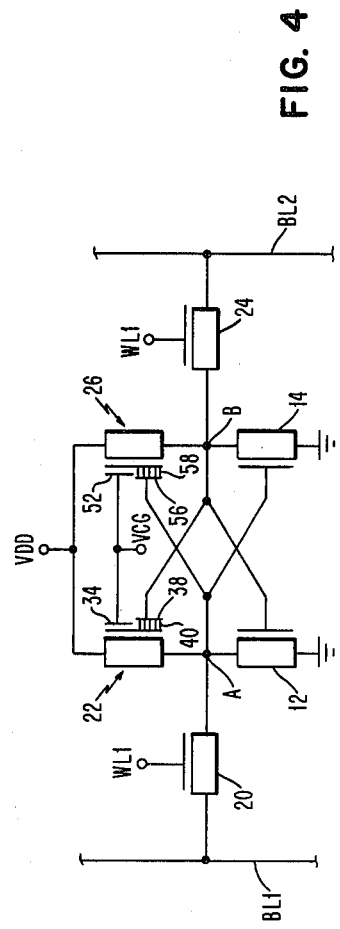
FIG. 4 is a circuit diagram of a second embodiment of the non-volatile memory cell of the present invention.

In FIG. 4 of the drawings, there is illustrated a second embodiment of the non-volatile memory cell of the present invention. In this embodiment of the cell the first and second non-volatile devices 22 and 26 are used as load elements coupled to the first and second cross-coupled transistors 12 and 14. The first non-volatile device 22 is serially arranged with the first cross-coupled transistor 12 and the second non-volatile device 26 is serially arranged with the second cross-coupled transistor 14. The second control gate 38 of the first non-volatile device 22 is connected to data node B and the second control gate 56 of the second non-volatile device 26 is connected to data node A, with the first control gates 34 and 52 being connected to the pulse source terminal VCG.

It can be seen that with, e.g., +5 volts applied to the first control gates 34 and 52, the cell of FIG. 4 can be operated as a conventional volatile static latch circuit. When power applied to the cell at terminal VDD is to be interrupted, the voltage at terminal VCG is increased to, say, +20 volts. If node B is at +5 volts, the threshold voltage of the non-volatile device 22 will not change, but with a zero voltage at node A the threshold voltage of the non-volatile device 26 will increase in the same manner as the threshold voltage increased in the first non-volatile device 22 in the cell of FIG. 1. To restore data to nodes A and B a voltage of +5 volts is applied to terminal VCG after power is applied to terminal VDD. Since the threshold voltage of the non-volatile device 22 had not changed node A will rise to approximately +5 volts and node B will remain at zero volts. This complemented data may then be handled in the same manner as described hereinabove in connection with that of the cell illustrated in FIG. 1 of the drawings.

It can be seen that the cell of FIG. 4 requires fewer elements than does the cell of FIG. 1, and it should also be noted that, if desired, only one of the two non-volatile devices 22 and 26 need be used, with the other device being replaced by a load resistor or a standard field effect transistor in a known manner.

Figure 5:
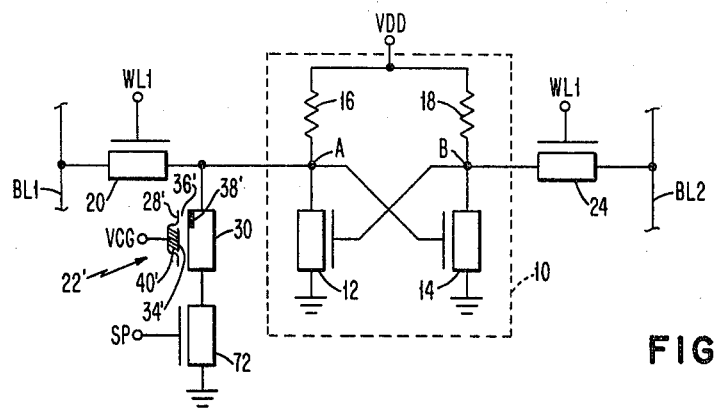
FIG. 5 is a circuit diagram of a third embodiment of the non-volatile memory cell of the present invention.

There is illustrated in FIG. 5 a third embodiment of the non-volatile memory cell of the present invention. In this embodiment the flip-flop or latch circuit 10 and the first and second input/output transistors 20 and 24 operate in a normal manner to form a volatile static latch circuit as described hereinabove in connection with the operation of the cell shown in FIG. 1 of the drawings. However, in the cell of FIG. 5 a shadow device, non-volatile device 22', is arranged in parallel with the first cross-coupled transistor 12 of latch circuit 10. The non-volatile device 22' includes a first control gate 34' insulated from the surface of the semiconductor substrate 30 and separated from floating gate 28' by a dual electron injector structure 40'. A diffusion region 38' under a portion of the floating gate 28' serves as the second control gate which is connected to data node A of the latch circuit 10. A thin insulating layer 36' forms a capacitor with the floating gate 28' and the diffusion region 38' which has a relatively high capacitance value. It can be seen that the non-volatile device 22' is essentially a three port device of the type illustrated in FIG. 2 of the above identified Kotecha and Wiedman U.S. patent application. Connected serially with the non-volatile device 22' is a grounded field effect transistor 72 having a switching pulse terminal SP connected to its gate electrode.

In the operation of the cell illustrated in FIG. 5 of the drawings, the grounded transistor 72 is off and terminal VCG is at zero volts when the latch circuit 10 and the first and second input/output transistors are functioning in the volatile cell mode. When power applied to the cell at terminal VDD is to be interrupted, the voltage at terminal VCG is increased negatively to, say, −15 volts. If data node A is at zero volts, the threshold voltage of the non-volatile device 22' will not change, however, if data node A is at +5 volts the threshold voltage of the non-volatile device 22' will increase to about +5 volts. After power returns, i.e., after +5 volts is applied to terminal VDD, data node A is set to 5 volts by pulsing to +5 volts the word lines and bit line BL1, with bit line BL2 set at 0 volts. Applying +5 volts to terminals VCG and SP, with zero volts on word line WL1, data node A will be at zero volts if non-volatile device 22' has a low threshold but remain at +5 volts if non-volatile device 22' has a high threshold. Accordingly, it can be seen that in the embodiment of FIG. 5 of the drawings the original or true value of the data is restored from the non-volatile device 22' to data node A. Of course, as is known, the data at node B will automatically assume the complementary value to that of node A.

It can be seen that instead of grounding transistor 72, it may be connected to terminal VDD, in which case the non-volatile device 22' will act as a shadow device with respect to the first load resistor 16.

Figure 6:
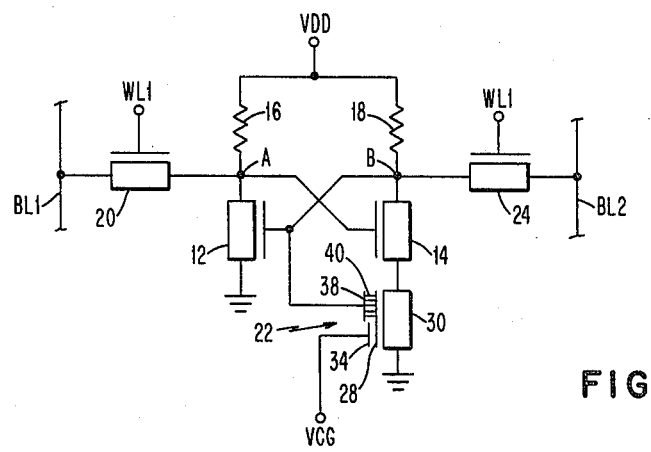
FIG. 6 is a circuit diagram of a fourth embodiment of the non-volatile memory cell of the present invention.

In FIG. 6 of the drawings there is illustrated a fourth embodiment of the non-volatile memory cell of the present invention. In this embodiment of the cell the non-volatile device 22 is serially connected with the second cross-coupled transistor 14 between the data node B and ground, with the second control gate 38 of device 22 connected to data node B.

In the operation of the fourth embodiment of the cell of the present invention, +5 volts is applied to the terminal VCG to turn on the non-volatile device 22 during normal volatile operation. When data from node B is to be transferred to the floating gate 28 of the non-volatile device 22, the voltage at the terminal VCG is increased to about +20 volts. If node B is at +5 volts, the threshold voltage of the non-volatile device 22 will not change, but with a zero voltage at node B the threshold voltage of the non-volatile device 22 will increase from about 1 volt to about +5 volts. When power is resumed, +5 volts is first applied to both VDD and VCG. Next, +5 volts is applied to both word line WL1 and bit line BL2, bit line BL1 being at ground. If non-volatile device 22 is in a low threshold voltage state, data node B will be latched to 0 volts and data node A at 5 volts after the word line WL1 is returned to 0 volts. However, if non-volatile device 22 is at a high threshold voltage state, data node B will remain at +5 volts so that data node A will be latched to 0 volts after the word line WL1 is reset to 0 volts. To erase the non-volatile device 22, negative pulses of say −20 volts are applied to control gate 34. If the device 22 is in a low threshold voltage state, the voltage between the control gates 38 and 34 is 20 volts, which does not affect the floating gate 28. If the device is at a high threshold voltage state, the voltage between the control gates 38 and 34 is over 25 volts thereby erasing the device 22.

It should be noted that, if desired, a second non-volatile device may be serially connected with the first cross-coupled transistor 12, with its second control gate connected to node A in FIG. 6 of the drawings.

Figure 7:
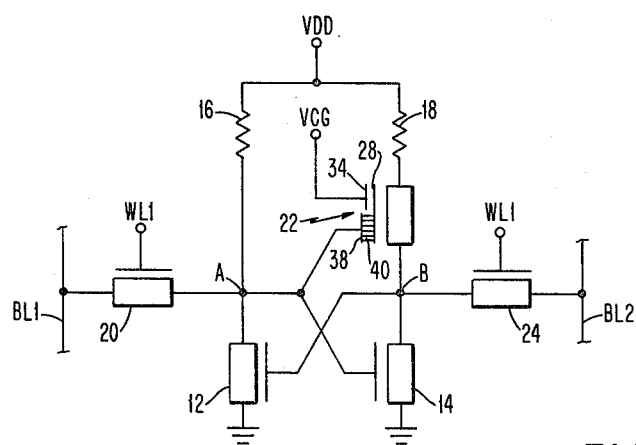
FIG. 7 is a circuit diagram of a fifth embodiment of the non-volatile memory cell of the present invention.

There is illustrated in FIG. 7 a fifth embodiment of the non-volatile cell of the present invention. In this embodiment of the cell the non-volatile device 22 is serially arranged with the second load resistor 18 between node B and the power supply terminal VDD. The second control gate of the non-volatile device 22 is connected to node A.

In the operation of the fifth embodiment of the cell of the present invention, +5 volts is applied to the terminal VCG to turn on the non-volatile device 22 during normal volatile operation of the cell. When data from node A is to be transferred to the floating gate 28 of the non-volatile device 22, the voltage at the terminal VCG is increased to about +20 volts. If node A is at +5 volts, the threshold voltage of the non-volatile device 22 will not change, but with a zero voltage at node A the threshold voltage of the non-volatile device 22 will increase to about +5 volts. To restore the data, +5 volts is applied to both terminals VDD and VCG. The word line WL1 is pulsed to +5 volts while maintaining the bit line BL1 at 0 volts and bit line BL2 at +5 volts. When the +5 volt pulse is removed from the word line WL1, for the case when the non-volatile device 22 is at low threshold voltage state, data node A will remain latched at 0 volts while the complementary data node B will remain latched at +5 volts. For the case when the non-volatile device 22 is at a high threshold voltage state, since the voltage required to maintain data node B at +5 volts does not exist, data node A will flip to +5 volts as a result of which data node B will be at zero volts sustained by the active device 14. The control gate terminal VCG is pulsed to −20 volts to erase the written non-volatile device 22. The voltage differential between the two control gates 34 and 38 of the low threshold voltage state non-volatile device is 20 volts, and, therefore, no change occurs. The same voltage differential for a high threshold voltage state non-volatile device is +25 volts. Therefore, the erasure of the high threshold voltage non-volatile device 22 occurs. Data may now be complemented and normal operation may resume.

It should be noted that, if desired, a second non-volatile device may be serially connected with the first load resistor, with its second control gate connected to node B in FIG. 7 of the drawings. It can be seen that the non-volatile devices may be located between the load resistors 16 and 18 and the terminal VDD rather than between the load resistors and the data nodes A and B. It should also be noted that for some semiconductor processes there is a significant advantage to laying out the cells or memory system with the non-volatile device serially arranged with respect to one of the cross-coupled latch transistors or with respect to the load element.

An improved non-volatile semiconductor memory has been described hereinabove which can operate normally at the high speeds known in random access memories, yet which will not lose its data when a power failure occurs. Volatile data is retained in a non-volatile device with the use of lower voltages dissipating an insignificant amount of power than has been known heretofore and with faster data transfer times from the volatile circuitry to the non-volatile device. Furthermore, the process for making the memory of the present invention is simpler than that used to make MNOS devices and the memory of the present invention uses substantially lower writing power levels than is required in floating gate devices written by hot electrons.

While the invention has been particularly shown and described with reference to preferred embodiments thereof, it will be understood by those skilled in the art that various changes in form and details may be made therein without departing from the spirit and scope of the invention.

What is claimed is:

1. A memory system comprising;
   a semiconductor substrate,
   a volatile memory cell having a data node formed in said substrate,
   a non-volatile device including:
   a floating gate capacitively coupled to said substrate,
   a first control gate,
   a thin insulating layer disposed between said floating gate and said first control gate,
   a second control gate, and
   a dual charge injector structure disposed between said floating gate and said second control gate,
   means for coupling one of said control gates of said non-volatile device to said data node, and
   means for applying control pulses to the other of said control gates of said non-volatile device for selectively transferring data between said data node and said floating gate.

2. A memory system as set forth in claim 1 wherein said dual charge injector structure is a dual electron injector structure.

3. A memory system as set forth in claim 1 wherein said charge injector structure has a capacitance substantially smaller than the capacitance formed by said first control gate, said insulating layer and said floating gate.

4. A memory system as set forth in claim 3 wherein said charge injector structure is an electron injector structure having at least one layer of silicon-rich silicon dioxide.

5. A memory system as set forth in claim 4 wherein said electron injector structure is a dual electron injector structure having two layers of silicon-rich silicon dioxide separated by a layer of substantially impurity-free silicon dioxide.

6. A memory system as set forth in claim 1 wherein said memory cell includes an input/output transistor and said floating gate is disposed between said input/output transistor and said data node.

7. A memory system as set forth in claim 1 wherein said memory cell includes a voltage source terminal and said floating gate is disposed between said terminal and said data node.

8. A memory system as set forth in claim 7 wherein said memory cell includes a load resistor disposed between said terminal and said floating gate.

9. A memory system as set forth in claim 1 wherein said memory cell includes first and second cross-coupled transistors and said floating gate is disposed between said first transistor and a point of reference potential.

10. A memory system comprising;
    a semiconductor substrate,
    a volatile memory cell having first and second data nodes formed in said substrate,
    first and second non-volatile devices, each of said devices including;
    a floating gate capacitively coupled to said substrate,
    a first control gate,
    a thin insulating layer disposed between said floating gate and said first control gate,
    a second control gate, and
    a dual electron injector structure disposed between said floating gate and said second control gate,
    means for coupling the second control gate of said first non-volatile device to said first data node, means for coupling the second control gate of said second non-volatile device to said second data node, and means for applying control pulses to the first control gates of said first and second non-volatile devices for selectively transferring data from said first and second data nodes to said floating gates.

11. A memory system as set forth in claim 10 wherein said memory cell further includes first and second input/output transistors coupled to a word line and to first and second bit lines, respectively, said first non-volatile device being disposed between said first input/output transistor and said first data node and said second non-volatile device being disposed between said second input/output transistor and said second data node.

12. A memory system as set forth in claim 10 wherein said memory cell further includes a voltage source terminal, said first non-volatile device being disposed between said first data node and said terminal and said second non-volatile device being disposed between said second data node and said terminal.

13. A non-volatile random access memory comprising;
a semiconductor substrate,
a plurality of memory cells, each of said cells including:
a volatile cell having a data node formed in said substrate,
a floating gate capacitively coupled to said data node through said substrate,
first and second capacitors, each of said capacitors being directly coupled to said floating gate,
a dual charge injector structure disposed within one of said capacitors and
an input/output transistor,
a first word line coupled to a control electrode of a first portion of said plurality of memory cells,
a second word line coupled to a control electrode of a second portion of said plurality of memory cells,
means for selectively applying voltage pulses to said word lines,
a first bit line coupled to a first cell of said first portion of cells and to a first cell of said second portion of cells, said first bit line being coupled through the input/output transistor to said data node of said first cells,
a second bit line coupled to a second cell of said first portion of cells and to a second cell of said second portion of cells, said second bit line being coupled through said input/output transistor to said data node of said second cells, and
voltage pulsing means coupled through said first and second capacitors to the data node of each of said plurality of memory cells for selectively transferring charge between said charge injector structure and said floating gate.

14. A non-volatile random access memory as set forth in claim 13 wherein within each memory cell said charge injector structure is a dual electron injector structure disposed in said first capacitor coupling said floating gate to said data node.

15. A non-volatile random access memory as set forth in claim 14 wherin said second capacitor has a capacitance substantially larger than the capacitance of said first capacitor.

16. A non-volatile random access memory as set forth in claim 13 wherein within each memory cell said charge injector structure is a dual electron injector structure disposed in said second capacitor coupling said floating gate to said voltage pulsing means.

17. A non-volatile random access memory as set forth in claim 16 wherein said first capacitor has a capacitance substantially larger than the capacitance of said second capacitor.

* * * * *